(12) United States Patent
Dangy-Caye

(10) Patent No.: US 9,756,760 B2
(45) Date of Patent: Sep. 5, 2017

(54) ELECTRONIC EQUIPMENT WITH DOUBLE COOLING

(71) Applicant: SAGEMCOM BROADBAND SAS, Rueil Malmaison (FR)

(72) Inventor: Nicolas Dangy-Caye, Rueil Malmaison (FR)

(73) Assignee: Sagemcom Broadband SAS, Rueil Malmaison (FR)

( * ) Notice: Subject to any disclaimer, the term of this patent is extended or adjusted under 35 U.S.C. 154(b) by 0 days.

(21) Appl. No.: 15/037,551

(22) PCT Filed: Dec. 2, 2014

(86) PCT No.: PCT/EP2014/076320
§ 371 (c)(1),
(2) Date: May 18, 2016

(87) PCT Pub. No.: WO2015/086385
PCT Pub. Date: Jun. 18, 2015

(65) Prior Publication Data
US 2016/0302327 A1    Oct. 13, 2016

(30) Foreign Application Priority Data
Dec. 13, 2013   (FR) ...................................... 13 62599

(51) Int. Cl.
*H05K 7/20*   (2006.01)
*H05K 1/02*   (2006.01)

(52) U.S. Cl.
CPC ....... *H05K 7/20145* (2013.01); *H05K 1/0203* (2013.01); *H05K 7/20127* (2013.01); *H05K 7/20136* (2013.01)

(58) Field of Classification Search
CPC . G06F 1/181–1/182; H05K 7/20218–7/20381;
(Continued)

(56) References Cited

U.S. PATENT DOCUMENTS 4,129,743 A * 12/1978 Lohsl ................... H02G 15/076
174/16.1
4,495,780 A *  1/1985 Kaneko ................... F25B 49/02
174/15.1
(Continued)

FOREIGN PATENT DOCUMENTS

EP           2138922 A1   12/2009
EP           2603068 A2    6/2013
WO   WO 2009/057124 A2    5/2009

*Primary Examiner* — Anthony Haughton
*Assistant Examiner* — Razmeen Gafur
(74) *Attorney, Agent, or Firm* — Muncy, Geissler, Olds & Lowe, P.C.

(57) ABSTRACT

Electronic equipment comprising a casing provided with lower and upper ventilation openings and with a forced-ventilation fan having an inlet in communication with the inside of the casing and an outlet opening to the outside of the casing. At least one internal partition delimits at least a peripheral chamber and a central chamber toward the top of which the fan is mounted. The openings are arranged to create a natural ventilation flow from the lower openings to the upper openings when the fan is not running and a forced-ventilation flow from the lower openings and the upper openings as far as the fan when the fan is running.

17 Claims, 3 Drawing Sheets

(58) Field of Classification Search
CPC ............... H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/756, 741, 686, 687, 725, 787, 789; 165/80.1–80.5, 104.33, 185; 174/15.1–15.3, 16.1–16.3, 547, 548; 257/712–722, E23.088; 24/453, 458–459; 454/184; 312/236; 348/787, 789, 794; 349/56–60

See application file for complete search history.

(56) References Cited

U.S. PATENT DOCUMENTS

| | | | | |
|---|---|---|---|---|
| 5,085,057 A * | 2/1992 | Thompson | ............... | F24F 13/20 165/135 |
| 5,477,029 A * | 12/1995 | Skutt | ............... | F27B 17/02 219/390 |
| 6,108,202 A * | 8/2000 | Sumida | ............... | B60R 16/0238 361/690 |
| 6,195,262 B1 * | 2/2001 | Bodette | ............... | G06F 1/18 361/728 |
| 6,560,106 B2 * | 5/2003 | Ivey | ............... | H05K 7/1494 165/104.33 |
| 6,571,572 B2 * | 6/2003 | Hobbs | ............... | F24F 13/20 361/679.46 |
| 6,637,505 B1 * | 10/2003 | Sasaki | ............... | H05K 7/20336 165/104.33 |
| 6,771,503 B2 * | 8/2004 | Kimball | ............... | H05K 7/20009 257/722 |
| 7,457,112 B2 * | 11/2008 | Fukuda | ............... | G11B 33/022 361/679.48 |
| 7,859,834 B2 * | 12/2010 | Fukuda | ............... | G11B 33/022 361/679.46 |
| 8,289,716 B2 * | 10/2012 | Patel | ............... | H01H 3/122 361/728 |
| 8,373,990 B2 * | 2/2013 | Jarmany | ............... | H05K 7/20445 174/526 |
| 8,599,558 B2 * | 12/2013 | Kobayashi | ............... | G06F 1/183 361/690 |
| 8,817,471 B2 * | 8/2014 | Barna | ............... | A62C 3/16 109/31 |
| 8,845,793 B2 * | 9/2014 | Manahan | ............... | B01D 46/001 361/695 |
| 2003/0043545 A1 * | 3/2003 | Ivey | ............... | H05K 7/1494 361/695 |
| 2003/0156385 A1 | 8/2003 | Askeland et al. | | |
| 2010/0092275 A1 * | 4/2010 | Savitz | ............... | F24C 7/08 415/1 |
| 2010/0163210 A1 * | 7/2010 | Kluge | ............... | H01L 23/473 165/80.3 |
| 2010/0281884 A1 * | 11/2010 | Rawski | ............... | F25B 21/04 62/3.6 |
| 2011/0310560 A1 * | 12/2011 | Jarmany | ............... | H05K 7/2049 361/697 |
| 2013/0039783 A1 * | 2/2013 | Wagner | ............... | F04D 29/0563 417/313 |
| 2013/0077243 A1 * | 3/2013 | Kobayashi | ............... | G06F 1/183 361/697 |
| 2013/0137358 A1 * | 5/2013 | Manahan | ............... | F24F 13/20 454/184 |

* cited by examiner

ELECTRONIC EQUIPMENT WITH DOUBLE COOLING

BACKGROUND OF THE INVENTION

Field of the Invention

The present invention relates to electronic equipment for home or professional use such as, for example: an Internet gateway, multimedia equipment, etc.

Brief Discussion of the Related Art

Such equipment generally comprises a box containing electronic components that are to be connected to an electrical voltage source. In operation, most electrical components heat up and it is necessary to provide cooling means for preventing the temperature inside the box rising to such an extent as to become incompatible with correct operation of the equipment.

For equipment in which the electronic components heat little or withstand high temperatures, bottom and top openings are provided in the box so as to enable a stream of air to be formed within the box by convection, which stream flows naturally between the bottom and top openings. Natural ventilation is advantageous because of its silence, but it suffers from limited cooling capacity. The heat Q that can be dissipated is equal to h×S×ΔT, where h is the convective heat exchange coefficient, S is the surface area of the item, and ΔT is the temperature difference between the surface and the ambient air. In order to increase cooling capacity, it is therefore necessary to increase the convective heat exchange coefficient, i.e. to increase the number or the size of the openings, or to increase the area of contact with ambient air. This has an impact on the appearance of the equipment by having openings that are more visible and of size that is larger, which impacts make the equipment less attractive to potential users of the equipment. The convective heat exchange coefficient and the surface area of the equipment need to be optimized from the point of view of the heat that is to be dissipated for circumstances that are the least favorable (i.e. when the equipment is in a hot environment and is giving off a maximum amount of heat), whereas such circumstances occur for only a small amount of time in practice.

For equipment having greater cooling needs, bottom openings are provided in the box and a forced ventilation blower is provided that has an inlet in communication with the inside of the box and an outlet opening out to the outside of the box so that, when the blower is in operation, a forced ventilation stream is generated from the bottom openings to the blower. Forced ventilation is advantageous because of its effectiveness and the speed of the blower can be regulated as a function of cooling requirements. Unfortunately, operation of the blower is noisy and requires soundproofing means to be provided. In addition, in order to ensure that the blower is fully effective, it is necessary to provide leaktight ducts between the bottom openings and the inlet to the blower.

BRIEF SUMMARY OF THE INVENTION

An object of the invention is to provide equipment with improved cooling.

To this end, the invention provides electronic equipment comprising a box provided with ventilation openings and a forced ventilation blower having an inlet in communication with the inside of the box and an outlet opening to the outside of the box, the equipment being characterized in that: the box has at least one internal partition defining at least one peripheral chamber and a central chamber having the blower mounted in its top portion; at least one internal bottom opening being provided in the bottom portion of the box in the central chamber; at least one external bottom opening being provided in the bottom portion of the box in the peripheral chamber; at least one internal top opening being arranged in the top portion of the partition; and at least one external top opening being arranged in the top portion of the box in the peripheral chamber and/or in the central chamber; the openings being arranged to allow a natural ventilation stream from the bottom openings to the external top opening when the blower is stopped, and a forced ventilation stream from the bottom openings and the external top opening to the blower when the blower is in operation, at least one external top opening passing air in two different directions depending on the ventilation stream.

When stopped, the blower prevents direct communication from the central chamber to the outside so as to enhance the natural ventilation stream in the peripheral chamber, and in operation it serves to create and discharge the forced ventilation stream. Thus, the same openings are used for passing the natural ventilation stream and for passing the forced ventilation stream: the bottom opening acts always as an air inlet; the external top opening acts as an outlet for the natural ventilation stream and as an inlet for a portion of the forced ventilation stream; the internal top opening passes a portion of the forced ventilation stream from the peripheral chamber to the central chamber. It is thus possible to use one or the other of the ventilation modes as a function of cooling needs.

Preferably, the external top opening is provided in the top portion of the box in the peripheral chamber and the internal top opening also passes air in two different directions depending on the ventilation stream.

The internal top opening then passes a portion of the natural ventilation stream from the central chamber to the peripheral chamber and passes a portion of the forced ventilation stream from the peripheral chamber to the central chamber.

Also preferably, at least one external bottom opening is arranged in the bottom portion of the box in the central chamber.

This makes it possible to increase the stream of air that can flow in the central chamber, thereby improving the way in which the chamber is swept by said stream of air.

Other characteristics and advantages of the invention appear on reading the following description of particular, non-limiting embodiments of the invention.

BRIEF DESCRIPTION OF THE DRAWINGS

Reference is made to the accompanying drawings, in which.

DETAILED DISCUSSION OF THE PREFERRED EMBODIMENTS

Figure 1:
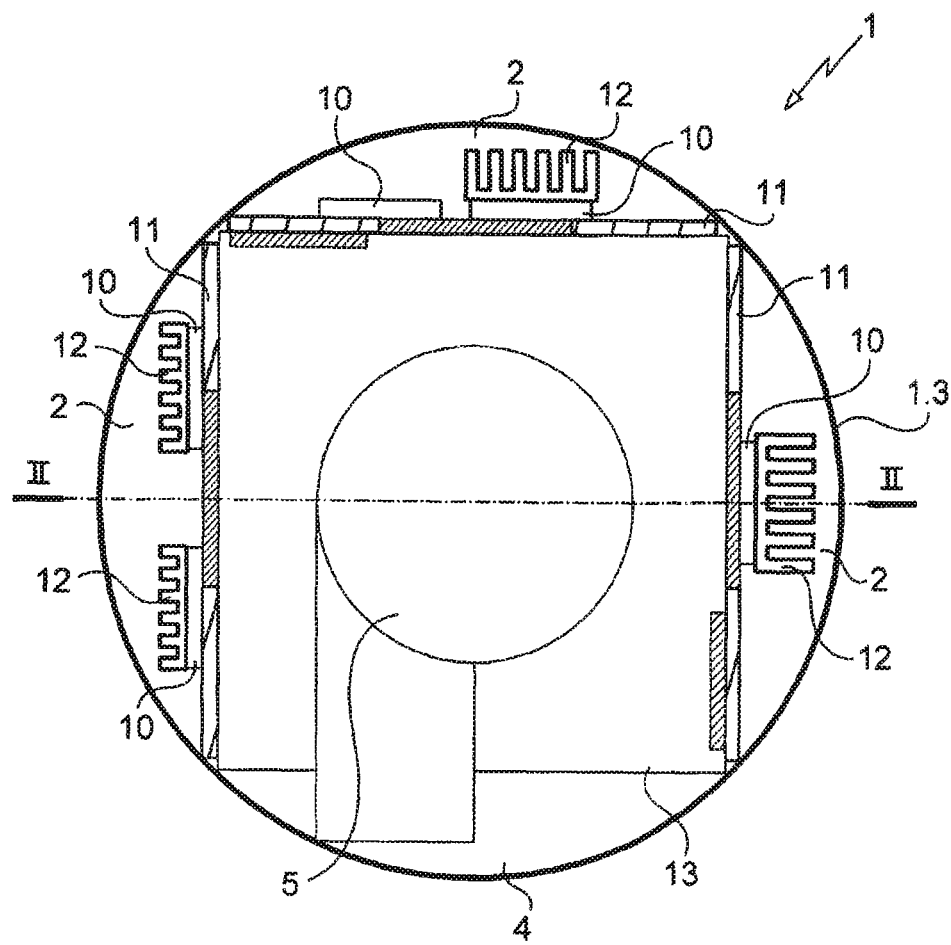
FIG. 1 is a diagrammatic section view from above of equipment in accordance with the invention.

The invention is described below in application to electronic equipment such as a computer gateway or a multimedia appliance.

With reference to FIGS. 1 to 4, the electronic equipment comprises a box, given overall reference 1, having a bottom wall 1.1, a top wall 1.2, and a peripheral wall 1.3 extending between the bottom and top walls 1.1 and 1.2 in order to define an enclosure.

The enclosure receives electronic components, in particular electronic components 10 carried on three printed circuit plates 11 that extend vertically between the bottom and top walls 1.1 and 1.2 in order to form partitions defining within the enclosure three peripheral chambers 2 surrounding a central chamber 3 that is substantially square in shape. The electronic components 10 lie on the sides of the printed circuit plates 11 facing towards the peripheral chambers 2, and in this example some of the components 10 are provided with respective radiators 12. A vertical wall 13 extends vertically between the bottom and top walls 1.1 and 1.2 to form a partition that defines within the enclosure a peripheral chamber 4 that closes the fourth side of the central chamber 3. The electronic components 10 are preferably components that are frequently in operation such as: power supply components that are continuously in operation to power the equipment, wireless communication components (e.g. of the WiFi type), that provide some minimum amount of data exchange for most of the time (i.e. other than while performing a downloading operation), . . . . These components are compatible with being cooled by natural ventilation for most of the time they are in operation.

The central chamber 3 receives a forced ventilation blower 5 that is fastened under the top wall 1.2 so as to be capable of having an inlet in communication with the inside of the central chamber 3 and an outlet opening to the outside of the box 1. The blower 5 is connected to a conventional control unit that is arranged to regulate the operation of the blower 5 as a function of temperatures detected inside the box 1. The inlet of the blower 5 is open substantially on the central vertical axis of the central chamber 3 and the outlet of the blower 5 opens out in the vicinity of the peripheral chamber 4. The central chamber 3 also receives at least one electronic component 20 secured to a printed circuit plate 21 that is fastened in the central chamber 3 in order to extend horizontally and divide the central chamber 3 into a bottom compartment 3.1 and a top compartment 3.2. The electronic component 20 is provided with a radiator 22 that is arranged in the top compartment 3.2 in the vicinity of the inlet of the blower 5. A storage device 23, such as a hard disk, is mounted in the bottom compartment 3.1.

It should be observed that the number and the type of electronic components, and indeed the electrical circuit interconnecting them, are of little importance so far as the invention is concerned.

The equipment is provided with ventilation openings, namely:

at least one external bottom opening 51 formed in the bottom portion of the box 1 in the central chamber 3 (preferably a plurality of external bottom openings 51 are arranged in this example in the bottom portion of the box 1 and distributed around the periphery of the central chamber);

at least one external bottom opening 52 arranged in the bottom portion of the box 1 in each of the peripheral chambers 2;

at least one internal top opening 53 defined in the top portion of each printed circuit plate 11;

at least one external top opening 54 arranged in the top portion of the box 1 in each peripheral chamber 2; and internal intermediate openings 55 defined in the printed circuit plate 21.

The external bottom openings 51 are arranged in the bottom wall 1.1 and thus open out in a bottom surface of the box 1.

The external bottom openings 52 are arranged in the bottom wall 1.1 and thus open out in the bottom surface of the box 1.

It should be observed that the box has feet 56 on which the box 1 stands so that the external bottom openings 51, 52 remain unobstructed.

Figure 2:
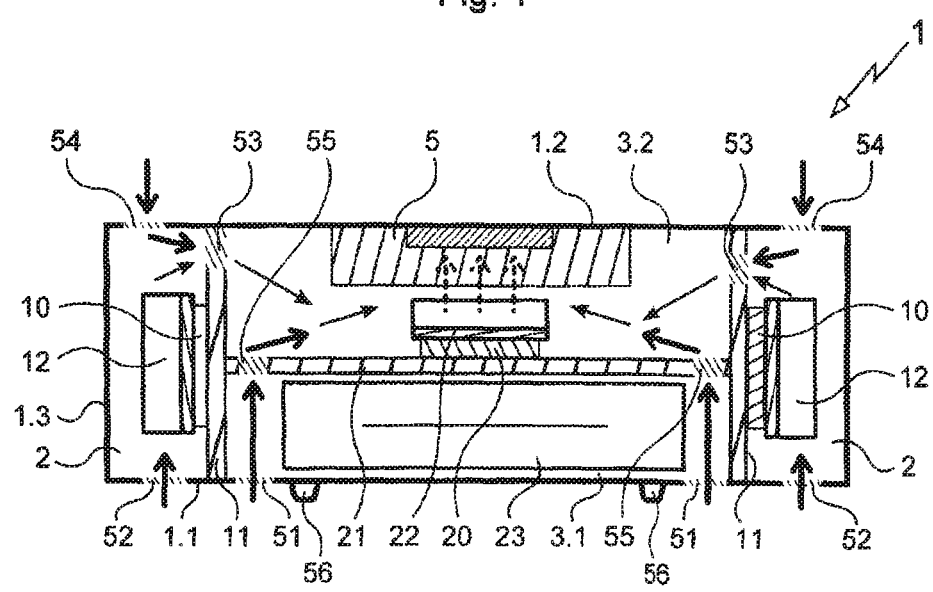
FIG. 2 is a diagrammatic view of the equipment in section on line II-II of FIG. 1, while in forced ventilation mode.
Figure 3:
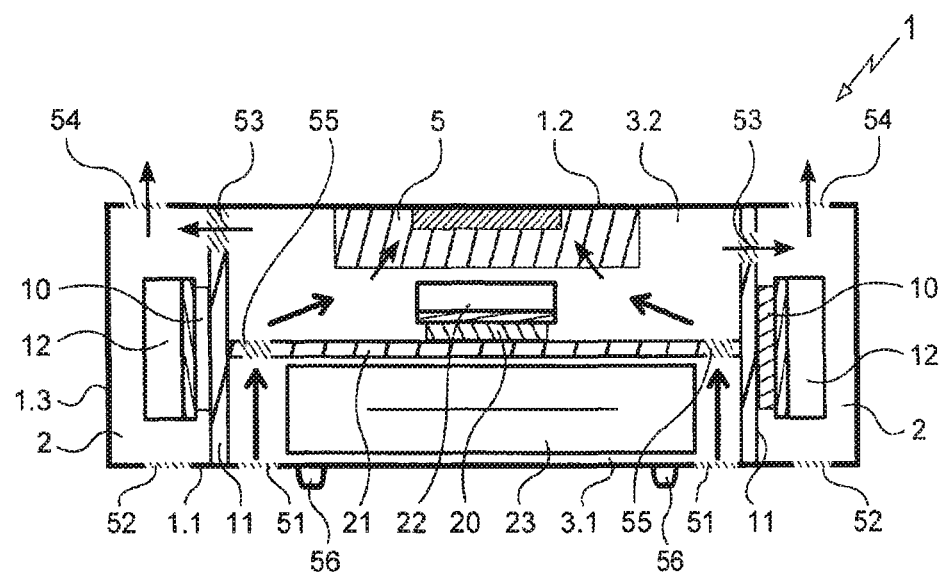
FIG. 3 is a view analogous to FIG. 2 showing the equipment in natural ventilation mode.
Figure 4A:
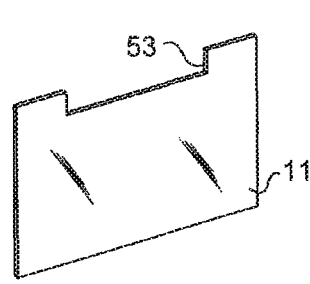
FIG. 4a is a diagrammatic perspective view of a partition separating the central chamber from one of the peripheral chambers.
Figure 4B:
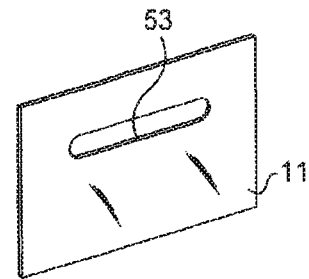
FIG. 4b is a diagrammatic view in perspective of a partition separating the central chamber from another one of the peripheral chambers.

In FIGS. 2 and 3, it can be seen on the right that the internal top opening 53 is cut out directly in the printed circuit plate 11 (FIG. 4b) and on the left that the internal top opening 53 comprises a notch formed in the top edge of the printed circuit plate 11, such that the internal top opening 53 is defined between the printed circuit plate 11 and the top wall 1.2 of the box (FIG. 4b).

The external top openings 54 are made in the top wall 1.2 and open out in the top surface of the box 1.

The internal intermediate openings 55 are cut out directly in the printed circuit plate 21 or they are defined by the printed circuit plate 11 and the edge of a notch formed in the printed circuit plate 21.

There follows a description of the principle on which the equipment is cooled while it is in operation.

The openings are arranged in this way to allow a natural ventilation stream to flow from the bottom openings to the external top opening when the blower is stopped, and a forced ventilation stream to flow from the bottom openings and the external top opening to the blower when the blower is in operation. When stopped, the blower 5 prevents direct communication from the central chamber 3 to the outside so as to encourage the natural ventilation stream to flow in the peripheral chamber 2, and when in operation it serves to create and discharge the forced ventilation stream.

More precisely, when the blower 5 is stopped, the heating of the electronic components gives rise to a convection phenomenon that produces:

a first natural ventilation stream in each peripheral chamber 2, this stream entering into the box 1 via the external bottom openings 52 and leaving it via the external top openings 54; and a second natural ventilation stream inside the box 1, this stream entering into the central chamber 3 via the internal bottom openings 51, passing via the internal intermediate openings 55 and then leaving the central chamber 3 via the internal top openings 53 in order to join the first natural ventilation stream and leave via the external top openings 54.

When the blower 5 is in operation, it creates the forced ventilation stream, which comprises:

a first forced ventilation stream in the central chamber 3, this stream entering the central chamber 3 via the internal bottom openings 51, passing via the internal intermediate openings 55 and then leaving the central chamber 3 via the blower 5;

a second forced ventilation stream in each peripheral chamber 2, this stream entering into the peripheral chambers 2 via the external bottom openings 52, penetrating into the central chamber 3 via the internal top openings 53, and then leaving the central chamber 3 via the blower 5; and a third forced ventilation stream in each peripheral chamber 2, this stream entering into the peripheral chambers 2 via the external top openings 54, penetrating into the central chamber 3 via the internal top openings 53, and then leaving the central chamber 3 via the blower 5.

It can be seen that the top openings 53, 54 pass air in two different directions depending on whether ventilation is natural or forced.

The openings of at least one of the peripheral chambers may present areas that are different from the areas of the openings of at least one other peripheral chamber when the peripheral chambers contain electronic components having different cooling needs.

It should be observed that the electronic components 10, 20 and their radiators 12, 22 are positioned so as to extend into the ventilation streams.

Figure 5:
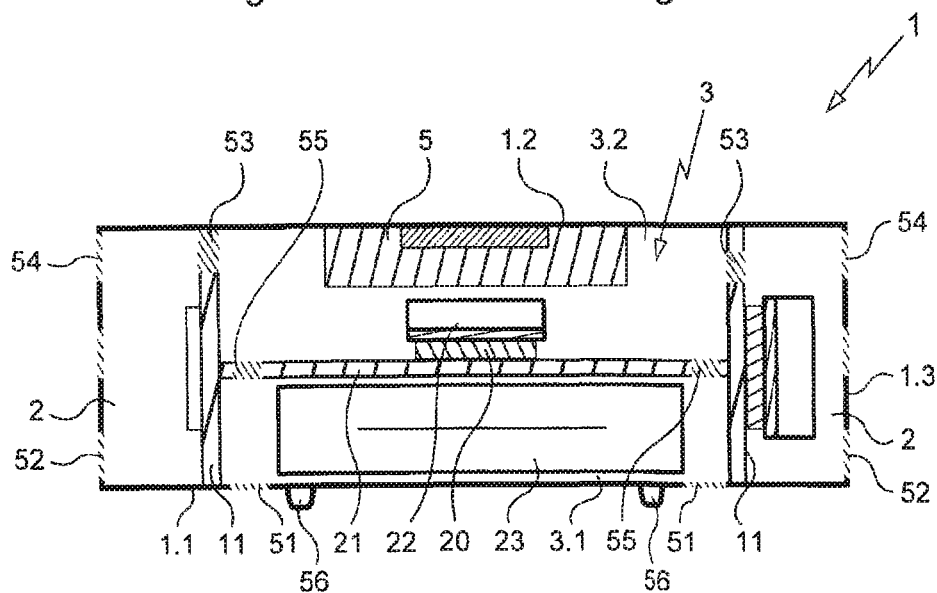
FIG. 5 is a view analogous to FIG. 2 showing equipment in a first variant embodiment of the invention.

In a first variant and with reference to FIG. 5:
the external bottom openings 52 are arranged in the bottom portion of the side wall 1.3 and thus open out in a side surface of the box 1;
the external top openings 54 are arranged in the top portion of the side wall 1.3 and thus open out in a side surface of the box 1; and
the box 1 is provided with external intermediate openings that are arranged in an intermediate (heightwise) portion of the side wall 1.3 and thus open out in a side surface of the box 1.

Figure 6:
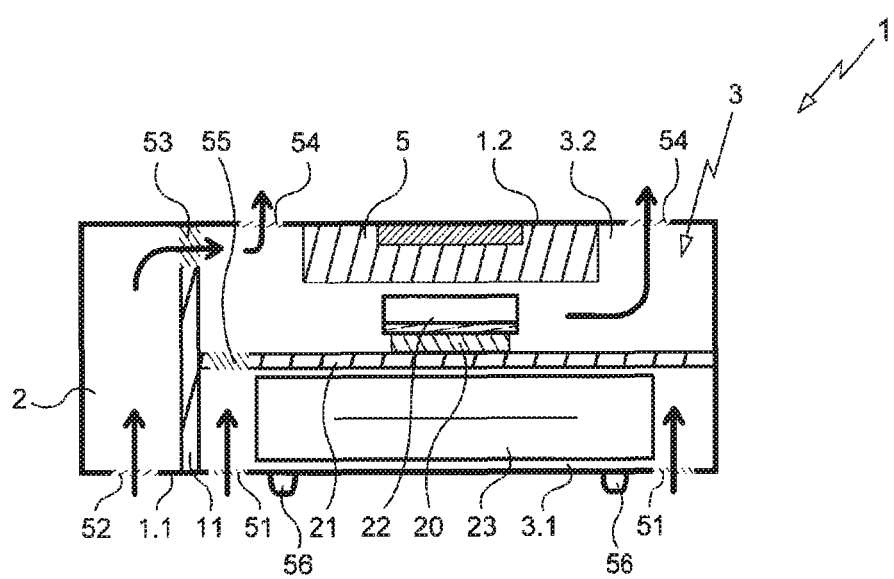
FIG. 6 is a view analogous to FIG. 2 showing equipment in a second variant embodiment of the invention.

In a second variant, and with reference to FIG. 6:
the box 1 in this example has only one peripheral chamber 2 and one central chamber 3 (or more precisely a main chamber);
external bottom openings 51 are arranged in the bottom portion of the bottom wall 1.1 so as to open out into the main chamber 3;
an external bottom opening 52 is arranged in the bottom portion of the bottom wall 1.1 so as to open out into the peripheral chamber 2;
an internal top opening 53 is defined in the top portion of the printed circuit plate 11 between the peripheral chamber 2 and the main chamber 3;
at least one external top opening 54 is arranged in the top wall 1.2 to open out into the main chamber 3 between the printed circuit plate 11 and the blower 5 (in this example there are several external top openings 54 arranged in the top wall 1.2 in order to open out at the periphery of the main chamber 3; and
internal intermediate openings 55 are defined in the printed circuit plate 21.

When the blower 5 is stopped, the heating of the electronic component generates a convection phenomenon that produces:
a first natural ventilation stream in each peripheral chamber 2, this stream entering into the box 1 via the external bottom opening 52, leaving the peripheral chamber via the internal top opening 53, and escaping via the external top openings 54; and
a second natural ventilation stream in the box 1, this stream entering the main chamber 3 via the external bottom openings 51, passing through the internal intermediate openings 55, and then leaving the main chamber 3 via the external top openings 54.

When the blower 5 is in operation, it creates the forced ventilation stream, which comprises:

a first forced ventilation stream in the main chamber 3, this stream entering into the main chamber 3 via the external bottom openings 51, passing through the internal intermediate openings 55, and then leaving the central chamber 3 via the blower 5;
a second forced ventilation stream in the peripheral chamber 2, this stream entering into the peripheral chamber 2 via the external bottom opening 52, penetrating into the main chamber 3 via the internal top opening 53, and then leaving the central chamber 3 via the blower 5; and
a third forced ventilation stream in the main chamber 3, this stream entering into the main chamber 3 via the external top openings 54 and then leaving the main chamber 3 via the blower 5.

It can be seen that the top openings 54 pass air in two different directions depending on whether the ventilation is natural or forced.

Naturally, the invention is not limited to the embodiments described, but covers any variant coming within the ambit of the invention as defined by the claims.

In particular, the type of equipment may be different from that described, the invention being applicable to cooling any electronic equipment whatsoever.

The equipment may have some other number of peripheral chambers in the box, and for example it could have a single peripheral chamber.

The invention claimed is:

1. An electronic equipment comprising a box provided with ventilation openings and a forced ventilation blower having an inlet in communication with the inside of the box and an outlet opening to the outside of the box, and means for controlling the blower, the equipment being wherein:
the box has at least one internal partition defining at least one peripheral chamber and a central chamber having the blower mounted in its top portion;
at least one external bottom opening is provided in the bottom portion of the box in the central chamber;
at least one external bottom opening is provided in the bottom portion of the box in the peripheral chamber;
at least one internal top opening is defined in the top portion of the partition; and
at least one external top opening is arranged in the top portion of the box in the peripheral chamber and/or in the central chamber;
the openings are arranged to allow a natural ventilation stream from the bottom openings to the external top opening when the blower is stopped, and a forced ventilation stream from the bottom openings and the external top opening to the blower when the blower is in operation, at least one external top opening passing air in two different directions depending on the ventilation stream.

2. The equipment according to claim 1, wherein the external top opening is provided in the top portion of the box in the peripheral chamber and the internal top opening also passes air in two different directions depending on the ventilation stream.

3. The equipment according to claim 1, wherein at least one external bottom opening is arranged in the bottom portion of the box in the central chamber.

4. The equipment according to claim 1, wherein at least one electronic component is mounted on the partition in the peripheral chamber.

5. The equipment according to claim 4, wherein a radiator is fastened on the component in order to extend into the ventilation streams.

6. The equipment according to claim 1, wherein the central chamber receives a printed circuit plate extending horizontally and dividing the central chamber into a bottom compartment and a top compartment, the printed circuit plate defining at least one internal intermediate opening for passing air from the bottom compartment to the top compartment.

7. The equipment according to claim 6, wherein an electronic component for cooling is mounted on the printed circuit plate in the top compartment in the vicinity of the inlet of the blower.

8. The equipment according to claim 1, wherein the external bottom opening opens out in a bottom surface of the box.

9. The equipment according to claim 1, wherein the external bottom opening opens out in a side surface of the box.

10. The equipment according to claim 1, wherein the external top opening opens out in a top surface of the box.

11. The equipment according to claim 1, wherein the external top opening opens out in a side surface of the box.

12. The equipment according to claim 1, wherein the internal top opening is arranged in the partition.

13. The equipment according to claim 1, wherein the internal top opening is defined between the partition and a top wall of the box.

14. The equipment according to claim 1, wherein the box has at least one external intermediate opening that opens out in a side surface of the box.

15. The equipment according to claim 1, wherein a plurality of peripheral chambers are defined in the box.

16. The equipment according to claim 15, wherein the openings of at least one of the peripheral chambers present areas that are different from the areas of the openings of at least one other peripheral chamber.

17. The equipment according to claim 1, wherein the internal partition is formed by a printed circuit plate.

\* \* \* \* \*